(12) United States Patent
Yokoyama et al.

(10) Patent No.: US 9,105,463 B2
(45) Date of Patent: Aug. 11, 2015

(54) SEMICONDUCTOR DEVICE

(71) Applicant: Panasonic Corporation, Osaka (JP)

(72) Inventors: Kenji Yokoyama, Kyoto (JP); Takeshi Kawabata, Osaka (JP); Kiyomi Hagihara, Osaka (JP)

(73) Assignee: Panasonic Corporation, Osaka (JP)

( * ) Notice: Subject to any disclaimer, the term of this patent is extended or adjusted under 35 U.S.C. 154(b) by 1 day.

(21) Appl. No.: 14/140,656

(22) Filed: Dec. 26, 2013

(65) Prior Publication Data

US 2014/0103544 A1 Apr. 17, 2014

Related U.S. Application Data

(63) Continuation of application No. PCT/JP2012/006095, filed on Sep. 25, 2012.

(30) Foreign Application Priority Data

Nov. 10, 2011 (JP) ................... 2011-246600

(51) Int. Cl.
*H01L 23/00* (2006.01)
*H01L 25/065* (2006.01)
(Continued)

(52) U.S. Cl.
CPC .............. *H01L 25/00* (2013.01); *H01L 23/585* (2013.01); *H01L 24/14* (2013.01); *H01L 24/17* (2013.01); *H01L 24/19* (2013.01); *H01L 25/0657* (2013.01); *H01L 23/3128* (2013.01); *H01L 24/05* (2013.01); *H01L 24/16* (2013.01); *H01L 24/32* (2013.01); *H01L 24/73* (2013.01); *H01L 24/81* (2013.01); *H01L 2224/0401* (2013.01); *H01L 2224/04042* (2013.01); *H01L 2224/04105* (2013.01); *H01L 2224/05572* (2013.01); *H01L 2224/12105* (2013.01);
(Continued)

(58) Field of Classification Search
CPC ... H01L 25/00; H01L 25/0657; H01L 23/585; H01L 24/05; H01L 24/16
USPC ................... 257/686, 685, E23.141
See application file for complete search history.

(56) References Cited

U.S. PATENT DOCUMENTS 5,046,161 A 9/1991 Takada
2004/0130023 A1 7/2004 Naiki
(Continued)

FOREIGN PATENT DOCUMENTS

JP 1-214141 8/1989
JP 2003-17530 1/2003
(Continued)

OTHER PUBLICATIONS

International Search Report of PCT Application No. PCT/JP2012/006095 dated Dec. 18, 2012.

*Primary Examiner* — Matthew W Such
*Assistant Examiner* — Krista Soderholm
(74) *Attorney, Agent, or Firm* — Panasonic Patent Center

(57) ABSTRACT

A semiconductor device includes an extended semiconductor chip including a first semiconductor chip and an extension outwardly extending from a side surface of the first semiconductor chip; and a second semiconductor chip connected to the extended semiconductor chip through a plurality of bumps and electrically connected to the first semiconductor chip. The first semiconductor chip is smaller than the second semiconductor chip. At least one external terminal is provided on the extension.

19 Claims, 7 Drawing Sheets

(51) Int. Cl.
*H01L 25/00* (2006.01)
*H01L 23/58* (2006.01)
*H01L 23/31* (2006.01)

(52) U.S. Cl.
CPC ............. *H01L 2224/14131* (2013.01); *H01L 2224/14134* (2013.01); *H01L 2224/14136* (2013.01); *H01L 2224/16145* (2013.01); *H01L 2224/16148* (2013.01); *H01L 2224/16225* (2013.01); *H01L 2224/16238* (2013.01); *H01L 2224/16245* (2013.01); *H01L 2224/1703* (2013.01); *H01L 2224/1713* (2013.01); *H01L 2224/17136* (2013.01); *H01L 2224/17517* (2013.01); *H01L 2224/32145* (2013.01); *H01L 2224/32225* (2013.01); *H01L 2224/48091* (2013.01); *H01L 2224/48227* (2013.01); *H01L 2224/48247* (2013.01); *H01L 2224/73203* (2013.01); *H01L 2224/73204* (2013.01); *H01L 2224/73253* (2013.01); *H01L 2224/73265* (2013.01); *H01L 2224/81191* (2013.01); *H01L 2224/81193* (2013.01); *H01L 2225/0651* (2013.01); *H01L 2225/06513* (2013.01); *H01L 2225/06517* (2013.01); *H01L 2225/06568* (2013.01); *H01L 2924/00014* (2013.01); *H01L 2924/15311* (2013.01); *H01L 2924/18162* (2013.01); *H01L 2924/19107* (2013.01); *H01L 2924/3511* (2013.01)

(56) References Cited

U.S. PATENT DOCUMENTS

| 2008/0230903 | A1  | 9/2008  | Sato            |         |
|--------------|-----|---------|-----------------|---------|
| 2008/0237883 | A1  | 10/2008 | Tago et al.     |         |
| 2009/0212425 | A1  | 8/2009  | Ito et al.      |         |
| 2010/0123244 | A1  | 5/2010  | Takeda          |         |
| 2010/0246144 | A1  | 9/2010  | Yamazaki et al. |         |
| 2012/0038044 | A1* | 2/2012  | Chang et al.    | 257/738 |

FOREIGN PATENT DOCUMENTS

| JP | 2004-172604 | 6/2004  |
|----|-------------|---------|
| JP | 2008-60587  | 3/2008  |
| JP | 2008-235666 | 10/2008 |
| JP | 2008-251912 | 10/2008 |
| JP | 2009-200394 | 9/2009  |
| JP | 2010-123602 | 6/2010  |
| JP | 2010-141080 | 6/2010  |
| WO | 2007/086481 | 8/2007  |
| WO | 2010/058646 | 5/2010  |

* cited by examiner

SEMICONDUCTOR DEVICE

CROSS-REFERENCE TO RELATED APPLICATIONS

This is a continuation of International Application No. PCT/JP2012/006095 filed on Sep. 25, 2012, which claims priority to Japanese Patent Application No. 2011-246600 filed on Nov. 10, 2011. The entire disclosures of these applications are incorporated by reference herein.

BACKGROUND

With miniaturization in a recent semiconductor manufacturing technique, the number of transistors forming a large scale integrated (LSI) circuit has increased. Particularly in a system LSI circuit, a required memory capacity has increased with complication and enlargement of components. Thus, it has been important that a method for efficiently mounting a system LSI circuit including a large-capacity memory is realized, considering a cost.

Meanwhile, a wire bonding method or a flip-chip method has been typically used as a method for connecting an LSI circuit and a package together. If such mounting methods are used, it is required that a memory is mounted in a chip of the system LSI circuit, on a chip mounted substrate, or on a mounting substrate. It is likely to result in, e.g., limitations on capacity of the memory to be mounted, an increase in mounting area on the substrate, and an increase in mounting cost.

A chip-on-chip (COC) structure is employed as one of techniques for the foregoing situation.

FIG. 12 illustrates a cross-sectional view of a typical COC structure. Referring to FIG. 12, a chip 101 and a chip 102 are electrically connected together through bumps 104. Each bump 104 is provided on a corresponding one of a plurality of pads (not shown in the figure) each provided on the chip 101 or the chip 102. A space between the chip 101 and the chip 102 is filled with underfill resin 105. The chip 101 includes pads (not shown in the figure) for wire bonding, and is connected to a substrate 103 through each wire 106 provided on a corresponding one of the pads for wire bonding. The chip 101, the chip 102, and the wires 106 are covered by mold resin 107 (only an outer shape thereof is indicated by a dashed line).

As described above, the COC structure allows the plurality of chips to be stacked and mounted on the substrate 103, and therefore the chips can be more efficiently bonded together within a smaller area as compared to the conventional wire bonding method and flip-chip method.

If the lower chip 101 has, referring to FIG. 13, a smaller area in the COC structure, a region enough for wire bonding cannot be formed. Moreover, when the bumps 104 are placed so as to be concentrated at the center of the chip, if the chip 101 and the chip 102 are stacked on each other, the upper chip 102 becomes unstable, and therefore parallelism of the upper chip 102 cannot be maintained.

External stress is applied to an inside of the LSI circuit (chip) through the pads placed on the LSI circuit. Thus, in the LSI circuit, the stress is applied to part of the LSI circuit corresponding to the placed pads, whereas the stress is not applied to the remaining part of the LSI circuit. In a stress distribution inside the chip, an expansion amount is different between the chip and an interposer (e.g., the substrate 103 in FIGS. 12 and 13) depending on a temperature, and therefore it is likely that greater stress is applied to an outer circumferential part of the chip.

Examples of influences of stress application on the LSI circuit include a change in characteristics of transistors. Thus, the characteristics of the transistors positioned right below the pads are changed, resulting in non-uniformity of the operation speed of each transistor of the LSI circuit. This influences operation timing of the LSI circuit. As a result, malfunction of the LSI circuit, reduction in yield ratio, etc. occur.

Japanese Unexamined Patent Publication No. 2010-141080 (hereinafter referred to as "Patent Document 1") discloses a semiconductor device including a semiconductor memory chip which includes an external connection terminal and first and second memory terminals and in which the external connection terminal and the first memory terminal are electrically connected together through a first memory interconnect layer, and a semiconductor logic circuit chip which is smaller than the semiconductor memory chip and which includes, on a principal surface thereof, first and second logic circuit terminals. The semiconductor logic circuit chip is stacked on the semiconductor memory chip such that at least the first memory terminal of the semiconductor memory chip and the first logic circuit terminal of the semiconductor logic circuit chip electrically contact each other.

Moreover, Japanese Unexamined Patent Publication No. 2008-060587 (hereinafter referred to as "Patent Document 2") discloses the technique by which a dummy terminal is provided on a semiconductor chip and on four corners or a diagonal line of an interposer.

SUMMARY

The technique disclosed in Patent Document 1 is on the basis that a chip stacked on an upper side is smaller than a chip stacked on a lower side. If the chip stacked on the lower side is smaller, the chips cannot be bonded together in a COC structure. Moreover, since the types (e.g., the memory chip and the logic circuit chip) of chips vary, required connection etc. also vary. Thus, it is not always possible to optionally determine which chip is stacked on the upper or lower side. Further, for the lower chip, wire bonding terminals, connection terminals to be connected to a substrate, and wires are necessary, and therefore the lower chip should be formed (designed) for the upper chip (i.e., the upper and lower chips should be simultaneously designed, or the lower chip should be designed after designing the upper chip). If the lower chip is individually formed and is smaller than the upper chip, the chips cannot be bonded together in the COC structure.

The technique disclosed in Patent Document 2 relates to a flip-chip, and is a technique for reducing stress on the chip corner parts and the chip diagonal line. Such a technique is not applicable as countermeasures against stress on the entirety of an outer circumferential part of a chip in a COC structure.

In the view of the foregoing, a technique for ensuring, in a semiconductor device having a COC structure, parallelism between upper and lower chips in the COC structure and a wire bonding region regardless of the sizes of the upper and lower chips will be described below.

The present inventors have conducted various studies, and have concluded as follows. That is, the present inventors have arrived at ensuring, in mounting of chips in a COC structure, of parallelism between the chips in the COC structure and a wire bonding region in such a manner that the size of the lower chip is expanded and at reduction in device malfunction due to stress in such a manner that bumps are placed within a particular region of an extension or a particular region of the chip.

Specifically, a semiconductor device of the present disclosure includes an extended semiconductor chip including a first semiconductor chip and an extension outwardly extending from a side surface of the first semiconductor chip; and a second semiconductor chip connected to the extended semiconductor chip through a plurality of bumps and electrically connected to the first semiconductor chip. The first semiconductor chip is smaller than the second semiconductor chip, and at least one external terminal is provided on the extension.

According to the foregoing semiconductor device, even if the first semiconductor chip is smaller than the second semiconductor chip (i.e., the area of the first semiconductor chip is smaller than that of the second semiconductor chip as viewed in the plane), the extended semiconductor chip in which the extension is provided around the first semiconductor chip can be used as a lower chip in a COC structure. That is, since the extension can be used when the second semiconductor chip is bonded onto the first semiconductor chip in the COC structure, parallelism can be maintained. Thus, a yield ratio in manufacturing of semiconductor devices can be improved, as well as reducing a manufacturing cost.

Since the external terminal (e.g., a pad for wire bonding) used for, e.g., connection between the semiconductor device and a mounting substrate is provided on the extension, a bonding region can be ensured even if the first semiconductor chip smaller than the second semiconductor chip is used as the lower chip in the COC structure.

A plurality of first pads may be provided on part of the second semiconductor chip facing the extension. A plurality of second pads may be provided on the extension. The plurality of bumps may include first bumps placed between the first semiconductor chip and the second semiconductor chip, and second bumps placed between the extension and the second semiconductor chip.

According to the foregoing, the bumps can be prevented from being concentrated on a particular region of the semiconductor chip, such as the vicinity of the center of the semiconductor chip. Moreover, the parallelism between the first semiconductor chip and the second semiconductor chip in the COC structure can be further ensured.

Each first bump and each second bump may have different heights.

Such a bump height difference can be used for ensuring the parallelism between the first semiconductor chip and the second semiconductor chip.

Each first bump may be connected to a corresponding one of third pads provided on the first semiconductor chip. A recess may be formed in each of the first, second, and third pads. Each first bump and each second bump may have different heights. The size of the recess in each third pad connected to a corresponding one of the first bumps may be different from the size of the recess in each first pad or each second pad connected to a corresponding one of the second bumps.

In the case where the bump is formed on the pad formed with the recess, a variation in size of the recess results in a variation in size (e.g., a height) of the bump provided on the recess. Thus, the height of the bump on the first semiconductor chip and the height of the bump on the extension can be differentiated from each other, and such a height difference can be used for ensuring the parallelism between the first semiconductor chip and the second semiconductor chip.

The thickness of the extension may be larger than that of the first semiconductor chip.

Even in the foregoing configuration, the extension can be used for ensuring the parallelism between the first semiconductor chip and the second semiconductor chip. In this case, e.g., the bumps placed between the extension and the second semiconductor chip are formed to have a height less than that of other bumps.

The thickness of the extension may correspond to a thickness obtained by adding the thickness of the first semiconductor chip to a distance between the first semiconductor chip and the second semiconductor chip.

According to the foregoing, a lower surface of the second semiconductor chip contacts an upper surface of the extension in the COC structure. Thus, the parallelism can be also ensured.

Each second bump disposed between the extension and the second semiconductor chip may be connected to a corresponding one of the first pads of the second semiconductor chip.

Each second bump disposed between the extension and the second semiconductor chip may be connected to a corresponding one of the second pads of the extension.

The bumps placed between the extension and the second semiconductor chip may have either one of the foregoing configurations. Moreover, the pads may be provided respectively on both of the extension and the second semiconductor chip. Since the bump positioned on the extension does not apply stress to the first semiconductor chip, malfunction in the first semiconductor chip can be prevented. Thus, the yield ratio in manufacturing of semiconductor devices is improved, and therefore the manufacturing cost is reduced.

The height of the bump and the thickness of the extension may be determined based on warpage of each of the first semiconductor chip, the second semiconductor chip, the extension, and the mounting substrate due to a difference between a temperature upon bonding and a temperature after bonding.

Alternatively, the height of the bump and the thickness of the extension may be determined based on the linear coefficient of expansion of each of the first semiconductor chip, the second semiconductor chip, the extension, and the mounting substrate.

In order to ensure the parallelism between the first semiconductor chip and the second semiconductor chip in the COC structure, the following configurations may be employed.

The plurality of bumps may be placed so as not to be positioned within a transistor placement region of at least one of the first semiconductor chip or the second semiconductor chip.

According to the foregoing, an influence of external stress applied to the bumps in bonding is less likely to be provided on transistors. As a result, e.g., a change in characteristics of the transistors and a variation in operation speed among the transistors can be reduced, as well as reducing malfunction of the semiconductor device. It is the most preferable that placement of the bumps within the transistor placement region is avoided. However, even if the bumps are placed within the transistor placement region, the bumps in such placement can be reduced to the extent possible to reduce malfunction.

The plurality of bumps may be placed within a region of at least one of the first semiconductor chip or the second semiconductor chip where a cell in which no malfunction due to a timing variation occurs is disposed. The cell in which no malfunction due to the timing variation occurs may be at least one of an electro-static discharge (ESD) protection cell, a Tie cell, a bonus cell, an area ratio adjustment cell, a power source capacity cell, an input Tie-fixed cell, or a level shifter.

This reduces malfunction of the semiconductor device.

At least one of the plurality of bumps may be disposed within a scribe lane or a seal ring region of at least one of the first semiconductor chip or the second semiconductor chip.

At least one of the plurality of bumps may be disposed within a chip corner cell region of at least one of the first semiconductor chip or the second semiconductor chip.

At least one of the plurality of bumps may be disposed on a power interconnect of at least one of the first semiconductor chip or the second semiconductor chip.

According to the foregoing, the influence of external stress applied to the bumps in bonding is less likely to be provided on the transistors. As a result, e.g., a change in characteristics of the transistors and a variation in operation speed among the transistors can be reduced, as well as reducing malfunction of the semiconductor device.

If there are bumps placed within a region different from the regions described above, the bumps in such placement can be reduced to the extent possible to reduce malfunction of the semiconductor device.

Both of the first semiconductor chip and the second semiconductor chip are more preferably in the foregoing bump placement. This realizes advantages such as reduction in malfunction in both chips.

The plurality of bumps may include dummy bumps which do not electrically connect the extended semiconductor chip and the second semiconductor chip together. The dummy bumps may be placed within a second region outside a first region where the first semiconductor chip and the second semiconductor chip are electrically connected together.

According to the foregoing, the dummy bumps can be used for ensuring the parallelism between the first semiconductor chip and the second semiconductor chip. The dummy bumps may be positioned on one or both of the extension and the first semiconductor chip.

The dummy bumps may be provided as some of the second bumps placed between the extension and the second semiconductor chip.

The first region may be at least one of a center part of the first semiconductor chip, a region of the first semiconductor chip along one or more sides thereof, a region of the first semiconductor chip near a corner thereof, or a band-shaped region of the first semiconductor chip formed apart from a pair of opposing sides of the first semiconductor chip.

Since the parallelism can be ensured by the dummy bumps, the bumps for electrical connection are not necessarily placed with in the center region of the semiconductor chip.

The first region may be in a substantially rectangular shape, and the dummy bumps may be formed along each of a pair of opposing sides of the first region.

The first region may be in a substantially rectangular shape, and the dummy bumps may be formed along each of four sides of the first region.

The first region may be in a substantially rectangular shape, and the dummy bumps may be formed along a corner part of the first region.

The dummy bumps may be placed as described above.

The dummy bumps may be provided as some of the first bumps placed between the extension and the second semiconductor chip.

The plurality of bumps may include bumps which are not electrically connected to the first semiconductor chip or the second semiconductor chip.

That is, such bumps contribute to fixing of the first semiconductor chip and the second semiconductor chip, but does not contribute to electrical bonding of the first semiconductor chip and the second semiconductor chip. This bumps realize the advantage that the parallelism is ensured in the COC structure.

The dummy bumps may be made of a non-metal material.

Examples of the non-metal material include resin. Such resin bumps can be used for ensuring the parallelism between the first semiconductor chip and the second semiconductor chip. Moreover, due to, e.g., a stiffness difference from metal bumps, stress applied through the bumps in bonding can be reduced. If the metal bumps are used, the bumps for electrical connection and the bumps for ensuring the parallelism are made of the same material, and therefore stress at a bonding part can be reduced.

The extension may be made of a metal material or resin.

The extension can be made of, e.g., the foregoing materials. Particularly in the case where resin is used, stress can be reduced because of its stiffness less than that of the semiconductor chip.

The semiconductor device of the present disclosure may further include a substrate on which the extended semiconductor chip and the second semiconductor chip are mounted. The substrate may be bonded to a surface of the extended semiconductor chip opposite to a surface of the extended semiconductor chip bonded to the second semiconductor chip. The external terminal may be a wire bonding pad, and may be connected to the substrate through a thin metal wire.

The semiconductor device of the present disclosure may further include a substrate on which the extended semiconductor chip and the second semiconductor chip are mounted. The substrate may be bonded to a surface of the extended semiconductor chip opposite to a surface of the extended semiconductor chip bonded to the second semiconductor chip, and the external terminal may be connected to the substrate through a ball electrode.

As described above, the extended semiconductor chip and the second semiconductor chip may be bonded to the substrate through the wire or be connected to the substrate through the ball electrode to form the semiconductor device mounted on the substrate.

According to the technique of the present disclosure, in the semiconductor device having the COC structure, the parallelism between the upper and lower chips in the COC structure and the bonding region of the chip and the substrate can be ensured regardless of the sizes of the upper and lower chips.

DETAILED DESCRIPTION

An example semiconductor device of the present disclosure will be described below with reference to drawings.

Figure 1:
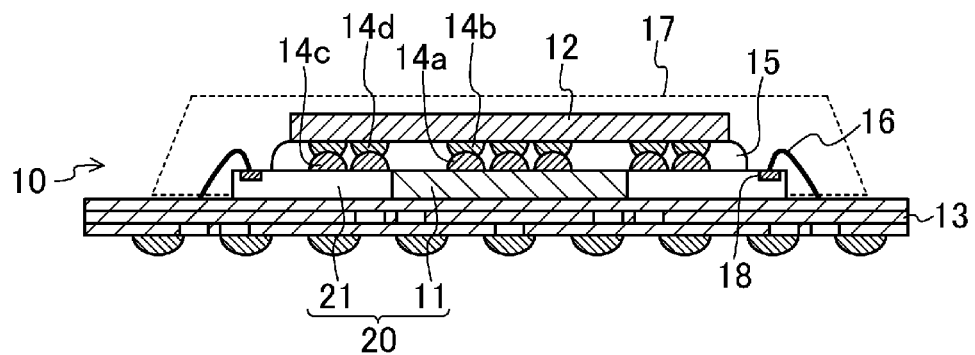
FIG. 1 is a view schematically illustrating a cross-sectional configuration of an example semiconductor device of the present disclosure.

FIG. 1 is a view schematically illustrating a cross section of an example semiconductor device 10. Referring to FIG. 1, the semiconductor device 10 includes a first semiconductor chip 11 and a second semiconductor chip 12. The semiconductor device 10 is mounted on a substrate 13. The first semiconductor chip 11 is a chip on a lower side (i.e., a side close to the substrate 13) in a COC structure. Moreover, the first semiconductor chip 11 is a chip having an area smaller than that of the second semiconductor chip 12 as viewed in the plane (see, e.g., FIG. 7).

The first semiconductor chip 11 and the second semiconductor chip 12 are electrically connected together through bumps 14a, 14b. The bumps 14a are formed respectively on pads (not shown in the figure) provided on the first semiconductor chip 11, and the bumps 14b are formed respectively on pads (not shown in the figure) provided on the second semiconductor chip 12. A space between the first semiconductor chip 11 and the second semiconductor chip 12 is filled with underfill resin 15.

An extension 21 made of, e.g., resin is provided around the first semiconductor chip 11, and the first semiconductor chip 11 and the extension 21 form an extended semiconductor chip 20. External terminals 18 (i.e., pads for wire bonding in this example) are provided on the extension 21, and the extension 21 is electrically connected to the substrate 13 through wires 16.

Pads (not shown in the figure) are also formed on the extension 21, and bumps 14c are formed respectively on the pads. The bumps 14c contribute, together with bumps 14d provided on the second semiconductor chip 12, to bonding between the second semiconductor chip 12 and the extended semiconductor chip 20. Note that a space between the extension 21 and the second semiconductor chip 12 is also filled with the underfill resin 15.

All or some of the bumps 14a, 14b, 14c, 14d are hereinafter sometimes collectively referred to as "bumps 14" or a "bump 14."

The first semiconductor chip 11, the second semiconductor chip 12, the extension 21, the bumps 14, the underfill resin 15, and the wires 16 are covered by mold resin 17 (only an outer shape thereof is indicated by a dashed line).

Since the extension 21 is, as described above, provided around the first semiconductor chip 11 to form the extended semiconductor chip 20, the first semiconductor chip 11 and the second semiconductor chip 12 can be bonded together with stability in the COC structure even when the first semiconductor chip 11 which is the lower chip is smaller than the second semiconductor chip 12 which is the upper chip. Moreover, since the external terminals 18 are provided on the extension 21, a region for wire bonding using the wires 16 can be ensured. Further, since the bumps 14c are placed on the extension 21, a parallelism between the first semiconductor chip 11 and the second semiconductor chip 12 can be ensured in the COC structure.

Although it has been described that the extension 21 is made of resin, the extension 21 may be made of other materials such as metal. Note that, if resin having stiffness less (i.e., softer) than metal, semiconductor, etc. is used, advantages such as stress reduction can be realized.

In the case illustrated in FIG. 1, the pads are formed on both of the extension 21 and part of the second semiconductor chip 12 facing the extension 21, and the bumps 14c, 14d are each formed on a corresponding one of the pads. The extension 21 and the second semiconductor chip 12 are connected together through the bumps 14c, 14d.

Alternatively, pads and bumps may be formed only on one of the extension 21 or the second semiconductor chip 12. Even in such a case, the extension 21 and the second semiconductor chip 12 can be bonded together through the bumps.

Figure 2:
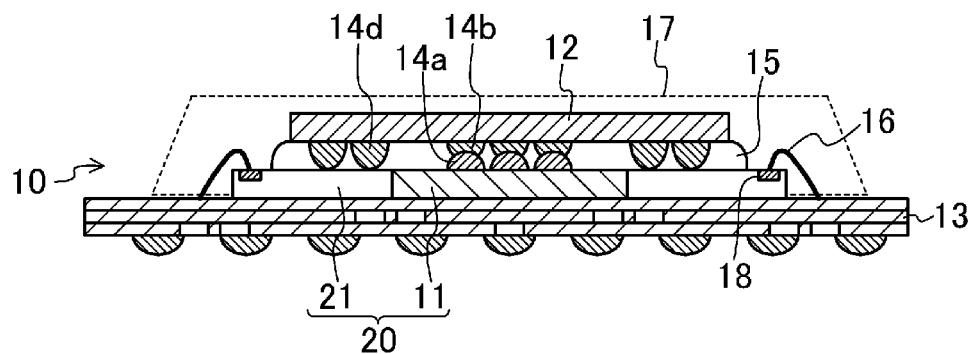
FIG. 2 is a view schematically illustrating a cross-sectional configuration of another example semiconductor device of the present disclosure.
Figure 3:
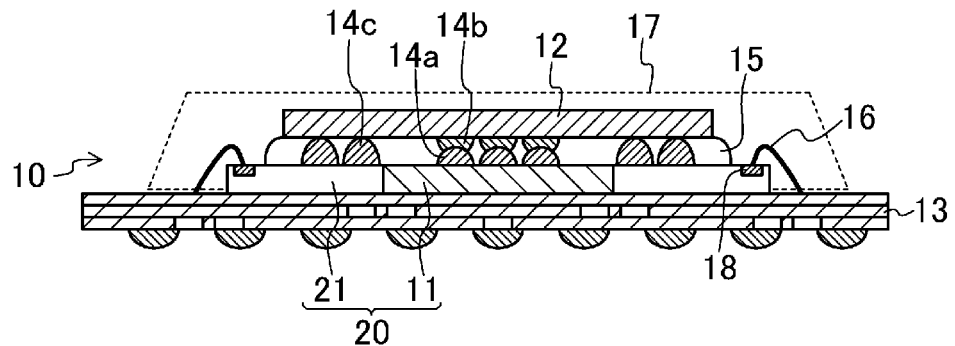
FIG. 3 is a view schematically illustrating a cross-sectional configuration of still another example semiconductor device of the present disclosure.

FIG. 2 illustrates a specific example where no bumps are formed on the extension 21, and the pads and the bumps 14d provided respectively on the pads are formed on the second semiconductor chip 12. FIG. 3 illustrates a specific example where the pads and the bumps 14c provided respectively on the pads are formed on the extension 21, and no bumps are formed on part of the second semiconductor chip 12 facing the extension 21.

In the case where bumps are formed only on one of chips as described above, a chip with conventional bump placement can be used as the other chip. Thus, a cost is reduced as compared to the case where bumps are formed on both chips.

In the examples illustrated in FIGS. 1, 2, and 3, the extension 21 has the same thickness as that of the first semiconductor chip 11. However, the present disclosure is not limited to such a configuration.

Figure 4:
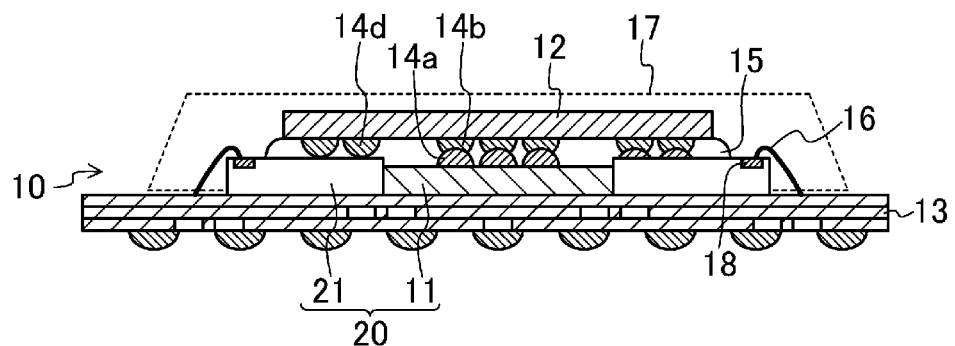
FIG. 4 is a view schematically illustrating a cross-sectional configuration of still another example semiconductor device of the present disclosure.

For example, the extension 21 may have, referring to FIG. 4, a thickness greater than that of the first semiconductor chip 11. In the case illustrated in FIG. 4, no bumps are formed on the extension 21, and the pads and the bumps 14d provided respectively on the pads are formed on part of the second semiconductor chip 12 facing the extension 21.

If the bumps are formed only on one of the extension 21 or the second semiconductor chip 12 as illustrated in FIGS. 2 and 3, adjustment of a bump size may be required to properly bond the extension 21 and the second semiconductor chip 12 together. For example, the size of the bumps positioned between the extension 21 and the second semiconductor chip 12 is increased as compared to that of the bumps positioned between the first semiconductor chip 11 and the second semiconductor chip 12 (this point will be further described later).

By contrast, the thickness of the extension 21 is increased as compared to that of the first semiconductor chip 11. This allows proper bonding without the foregoing bump size adjustment.

Figure 5:
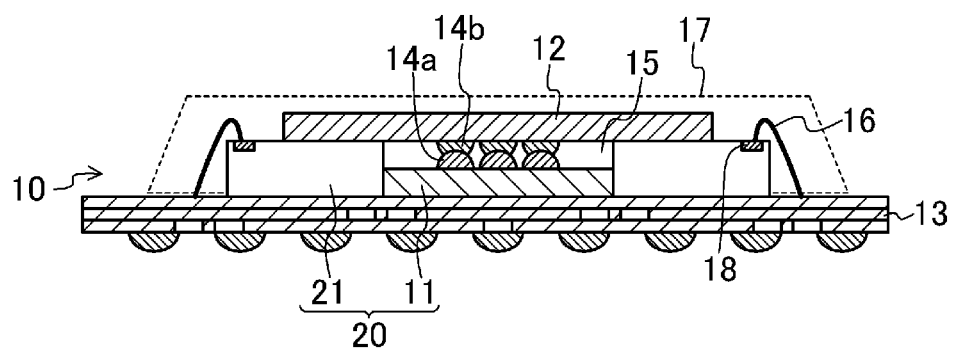
FIG. 5 is a view schematically illustrating a cross-sectional configuration of still another example semiconductor device of the present disclosure.

The structure in which no bumps are formed between the extension 21 and the second semiconductor chip 12 can be realized in such a manner that the thickness of the extension 21 is further increased. Such a case is illustrated in FIG. 5.

In this case, the thickness of the extension 21 corresponds to a dimension obtained by adding the thickness of the first semiconductor chip 11 to the width of a bonding gap between the first semiconductor chip 11 and the second semiconductor chip 12 (i.e., the dimension of a clearance between the chips in the COC structure).

Thus, when the second semiconductor chip 12 is bonded onto the first semiconductor chip 11 in the COC structure, the extension 21 contacts the second semiconductor chip 12. As a result, no bumps are necessary between the extension 21 and the second semiconductor chip 12.

Next, it will be described that the size is differentiated between the bump (14c, 14d) formed between the extension 21 and the second semiconductor chip 12 and the bump (14a, 14b) formed between the first semiconductor chip 11 and the second semiconductor chip 12.

For example, in the cases illustrated in FIGS. 2, 3, and 4, the bumps between the extension 21 and the second semiconductor chip 12 are formed so as to be larger than the other bumps, and therefore the parallelism between the first semiconductor chip 11 and the second semiconductor chip 12 can be ensured in the COC structure. Such a bump size difference can be realized in such a manner that, e.g., the size of a recess of the pad on which the bump is disposed is changed.

Figure 6:
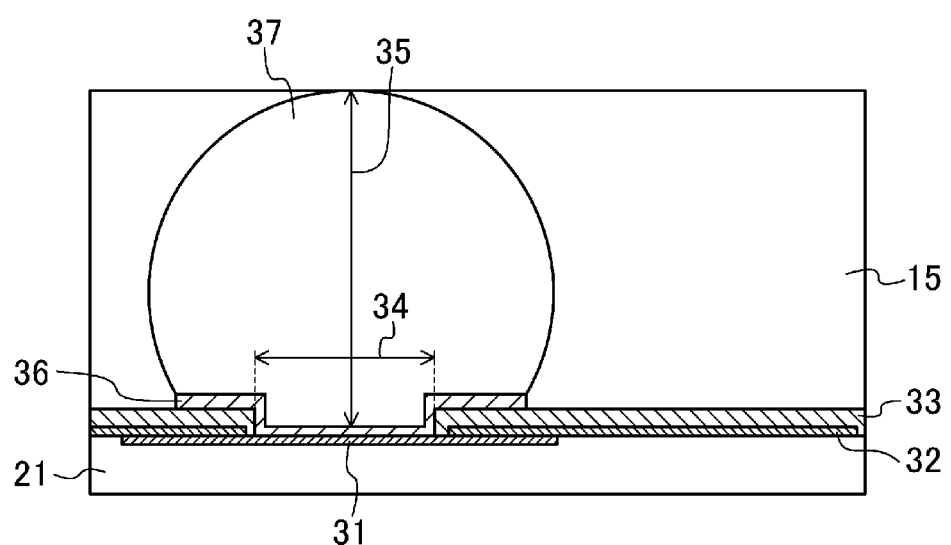
FIG. 6 is an enlarged cross-sectional view illustrating a bonding pad and a bump mounted on the bounding pad in the example semiconductor device of the present disclosure.

FIG. 6 is a schematic enlarged cross-sectional view illustrating, in the semiconductor device 10, a bump and the periphery of a pad on which the bump is mounted.

A pad metal 31 is disposed on an upper surface of the extension 21, and a passivation insulating film 32 covering the pad metal 31 and the extension 21 and an insulating film 33 covering the passivation insulating film 32 are formed. A recess is formed corresponding to the pad metal 31 in the passivation insulating film 32 and the insulating film 33. In such a state, the insulating film 33 extends inward beyond the passivation insulating film 32. An under-bump metal (UBM) pad 36 is formed so as to cover the recess and the periphery thereof. A bump 37 is formed on the UBM pad 36.

If the dimension of the recess of the insulating film 33 is a pad recess diameter 34, a bump height 35 varies depending on the pad recess diameter 34 (and therefore the volume of the recess). For the bump 37 having a certain volume, a smaller recess (i.e., a smaller pad recess diameter 34) results in a larger part of the bump 37 outside the recess, and therefore the bump height 35 increases. On the other hand, a larger recess (i.e., a larger pad recess diameter 34) results in a smaller part of the bump 37 outside the recess, and therefore the bump height 35 decreases.

Thus, the height of the bump 37 can be set in such a manner that the pad recess diameter 34 is set. Using such a method, the height of the bumps positioned between the extension 21 and the second semiconductor chip 12 can be increased or decreased as compared to the height of the bumps positioned between the first semiconductor chip 11 and the second semiconductor chip 12. Note that, although FIG. 6 illustrates the pad provided on the extension 21 and the bump (bump 14c illustrated in FIG. 3) formed on the pad, the same height adjustment method is applicable to the other bumps (bumps 14a, 14b, 14c illustrated in FIGS. 1, 2, and 3).

The pad recess diameter 34 in each section may be set based on the linear coefficient of expansion of each material forming, e.g., the extension 21, the substrate 13, and the bump 14. That is, due to a difference in linear coefficient of expansion among the materials and a difference between a temperature upon bonding and a temperature after bonding in the COC structure, warpage of the chips and the substrate upon bonding may be different from warpage of the chips and the substrate after bonding, and therefore a bonding gap between the extension 21 and second semiconductor chip 12 upon bonding may be different from a bonding gap between the extension 21 and the second semiconductor chip 12 after bonding. If the bonding gap is larger after bonding, the pad recess diameter 34 in the extension 21 is decreased such that the bump height 35 is increased. Conversely, if the bonding gap is smaller after bonding, the pad recess diameter 34 in the extension 21 is increased such that the bump height 35 is decreased. This can ensure the parallelism between the first semiconductor chip 11 and the second semiconductor chip 12.

Next, placement of the bumps and dummy bumps will be described with reference to FIG. 7.

Figure 7:
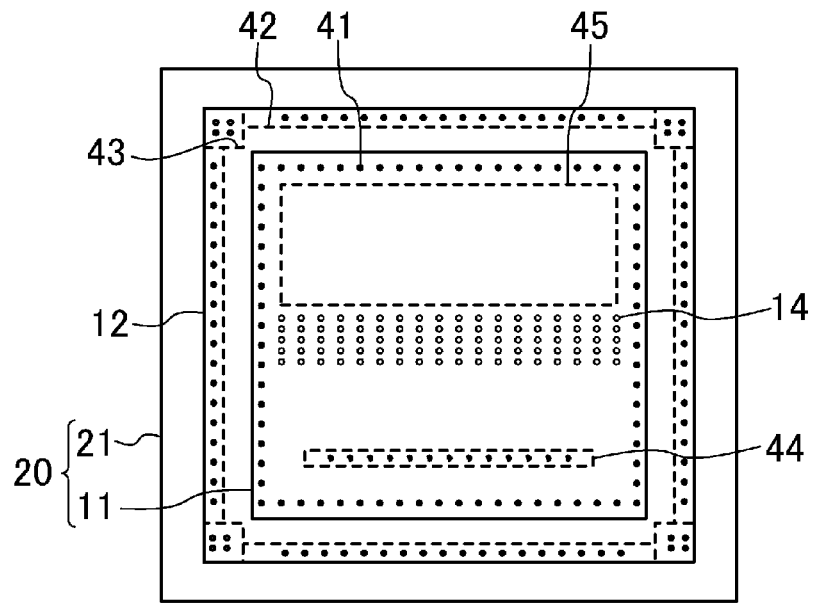
FIG. 7 is a plan view schematically illustrating placement of components of the example semiconductor device of the present disclosure.

FIG. 7 is a plan view schematically illustrating a positional relationship among components of the semiconductor device 10.

In FIG. 7, the bumps 14 configured to bond and electrically connect the first semiconductor chip 11 and the second semiconductor chip 12 together are placed. In addition to the bumps 14, bumps 41 configured to ensure the parallelism between the second semiconductor chip 12 and the extended semiconductor chip 20 in the COC structure are placed.

The bumps 14, 41 are placed so as not to be positioned within transistor placement regions 45 of the first semiconductor chip 11 and the second semiconductor chip 12. Thus, the parallelism in the COC structure can be ensured, as well as reducing, e.g., a change in LSI circuit operation timing and LSI circuit malfunction which are caused by a variation in transistor operation speed due to stress of the bumps.

The bumps 41 configured to ensure the parallelism may be placed in part of the first and second semiconductor chips where relatively many cells in each of which no LSI circuit malfunction due to a timing variation occurs are placed. Specific examples of the cells include ESD protection cells, Tie cells, bonus cells, area ratio adjustment cells, power source capacity cells, input Tie-fixed cells, and level shifters.

In such a case, even if operation timing of transistors varies due to stress of the bumps, LSI circuit malfunction due to such variation does not occur. Thus, the bumps 14, 41 are preferably placed as described above.

Alternatively, the bumps 41 configured to ensure the parallelism may be placed particularly on scribe lanes (i.e., regions at which a wafer is divided into a plurality of chips) of the first semiconductor chip 11 and the second semiconductor chip 12 or on seal ring regions (i.e., regions in each of which a structure for protecting chip elements etc. from, e.g., cracks from a chip end part and moisture is formed) of the first semiconductor chip 11 and the second semiconductor chip 12. FIG. 7 illustrates a scribe lane 42 or a seal ring region 42 and the bumps 41 placed in the scribe lane 42 or the seal ring region 42.

Since no transistors are placed in the scribe lane 42 or the seal ring region 42, LSI circuit malfunction does not occur even if stress of the bumps is applied.

Similarly, the bumps 41 may be placed in a chip corner cell region 43. Since no transistors are placed in the chip corner cell region 43, LSI circuit malfunction does not occur even if stress of the bumps is applied.

Due to a difference in size between the first semiconductor chip 11 and the second semiconductor chip 12, the region where the scribe lanes 42 or the seal ring regions 42 of the first semiconductor chip 11 and the second semiconductor chip 12 overlap with each other may be small, or such a region may not be formed. However, as long as the bumps are placed on the scribe lane 42 or the seal ring region 42 in either one of the chips, occurrence of malfunction in the chip can be reduced. Moreover, since the scribe lane 42 or the seal ring region 42 is positioned at an outer circumferential part of the chip, the scribe lane 42 or the seal ring region 42 of the second semiconductor chip 12 may face the extension 21. In such a case, malfunction does not occur in both chips.

As another alternative, the bumps 41 may be placed on a power interconnect(s) 44 of one or both of the first semiconductor chip 11 and the second semiconductor chip 12. In such a case, stress of the bumps 41 is not applied to the transistors, LSI circuit malfunction does not occur.

The foregoing bump placements may be variously combined together. For example, the bumps may be placed so as not to be positioned within the transistor placement region 42 of the first semiconductor chip 11, and may be placed in part of the second semiconductor chip 12 where relatively many cells in each of which no LSI circuit malfunction due to a timing variation occurs are placed.

The bumps are preferably placed on both of the first semiconductor chip 11 and the second semiconductor chip 12 as described above. However, even if the bumps are placed on one of the first semiconductor chip 11 or the second semiconductor chip 12 as described above, advantages such as reduction in malfunction in the chip can be realized.

Even if there are bumps (e.g., bumps placed in the transistor placement region) which are in placement other than the foregoing, the bumps in such placement are reduced to the extent possible to reduce malfunction etc.

In the foregoing configuration, the bumps 41 configured to ensure the parallelism may be bumps which are not electrically connected to the first semiconductor chip 11, the second semiconductor chip 12, and the extension 21. For example, in FIG. 6, the pad metal 31 may be provided, but no opening may be formed in the passivation insulating film 32 and the insulating film 33 which are formed above the pad metal 31.

The bumps 41 may be dummy bumps which are not bonded respectively to the pads. For example, in FIG. 6, the following structure may be employed: no pad metal 31 is formed; no opening is formed in the insulating film 33 etc.; and only the UBM pad 36 and the bump 37 provided on the UBM pad 36 are formed.

The bumps 41 configured to ensure the parallelism may be made of a metal material as in the bumps for electrical connection, or may be made of a non-metal material. For example, the bumps 41 may be formed as supports made of resin. In such a case, since the stiffness of resin is less than that of metal (i.e., resin is softer than metal), advantages such as stress reduction upon bonding can be realized.

Figure 8:
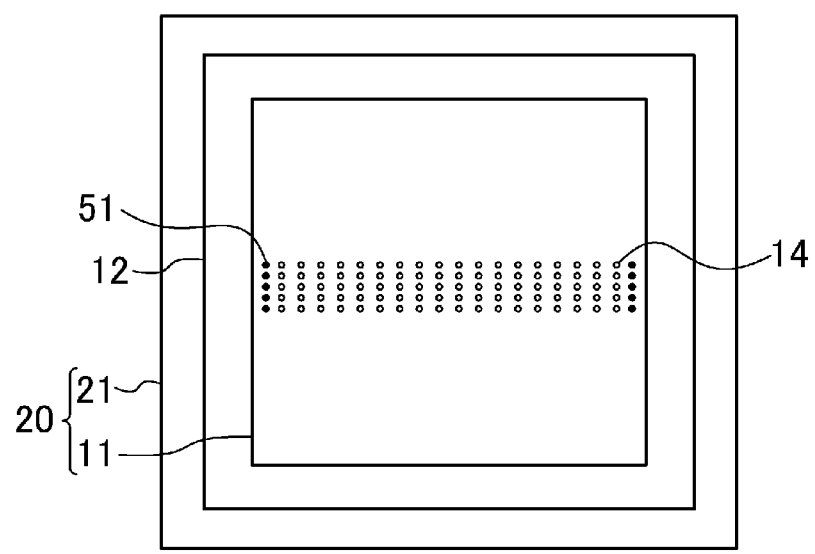
FIG. 8 is a plan view schematically illustrating another placement of the components of the example semiconductor device of the present disclosure.
Figure 9:
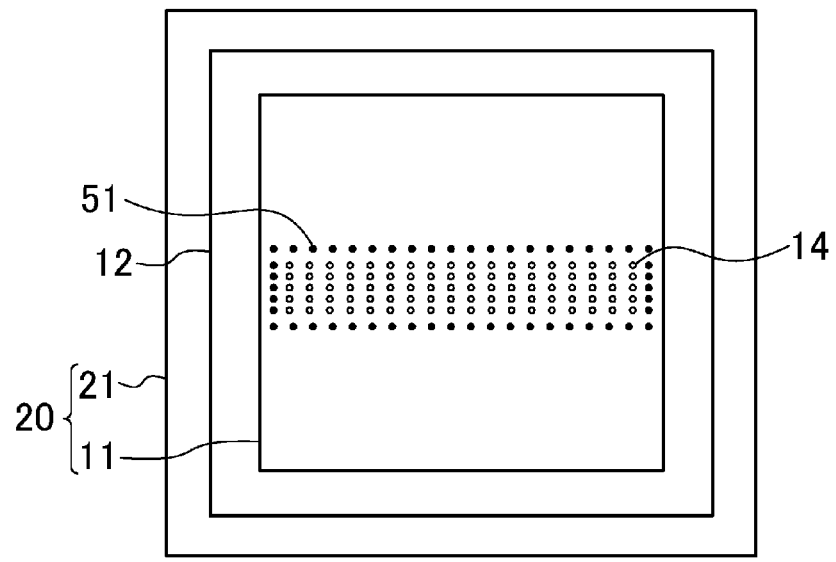
FIG. 9 is a plan view schematically illustrating still another placement of the components of the example semiconductor device of the present disclosure.
Figure 10:
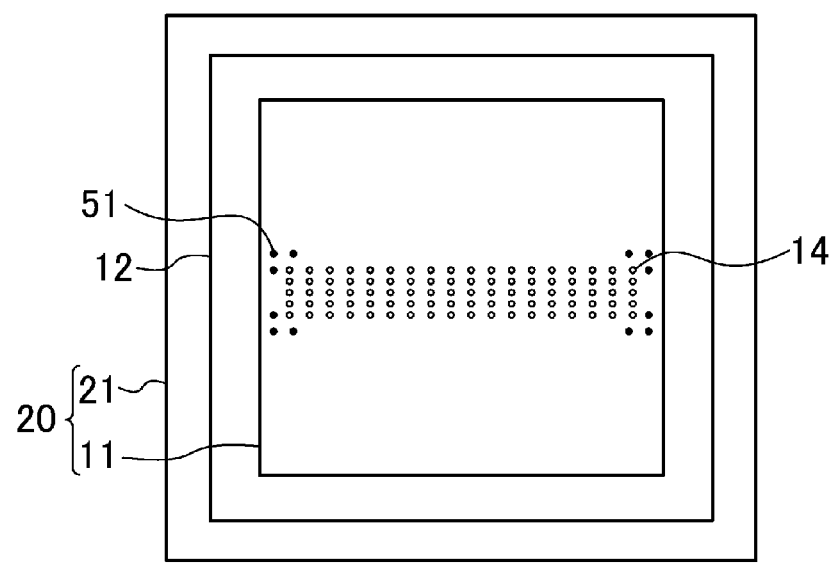
FIG. 10 is a plan view schematically illustrating still another placement of the components of the example semiconductor device of the present disclosure.

For the bumps 14 configured to bond and electrically connect the first semiconductor chip 11 and the second semiconductor chip 12 together, bumps 51 configured to ensure the parallelism may be placed as illustrated in FIG. 8, 9, or 10.

FIGS. 8-10 schematically illustrate a positional relationship among the components of the semiconductor device 10 as viewed in the plane. Moreover, FIGS. 8-10 illustrate the bumps 14 configured to bond and electrically connect the first semiconductor chip 11 and the second semiconductor chip 12 together, and the dummy bumps 51 configured to ensure the parallelism between the second semiconductor chip 12 and the extended semiconductor chip 20 (including the first semiconductor chip 11 and the extension 21 therearound) in the COC structure.

In the example illustrated in FIG. 8, the bumps 14 are placed within a substantially rectangular first region of the first semiconductor chip 11, and the dummy bumps 51 are placed along a pair of opposing sides of the first region.

In the example illustrated in FIG. 9, the bumps 14 are placed within a substantially rectangular first region as in the example illustrated in FIG. 8, and the dummy bumps 51 are placed along each of four sides of the first region.

In FIGS. 8 and 9, the dummy bumps 51 are placed in a single line along each side of the first region. However, the dummy bumps 51 may be placed in a plurality of lines such as two or three lines along each side of the first region.

In the example illustrated in FIG. 10, the bumps 14 are placed within a substantially rectangular first region as in the example illustrated in FIG. 8, and the dummy bumps 51 are placed along each of corners (corner parts) of the first region. Although the dummy bumps 51 are placed in a single line along each corner of the first region, the dummy bumps 51 may be placed in a plurality of lines such as two or three lines along each corner of the first region.

Since the dummy bumps 51 are, as described above, placed in addition to the bumps 14 configured to bond the chips together, the parallelism can be ensured in the COC structure.

In FIGS. 8-10, the bumps placed between the extension 21 and the second semiconductor chip 12 may be further provided as illustrated in FIGS. 1-4 and 7. Thus, the parallelism can be further ensured. In the case illustrated in FIG. 5, i.e., the case where the extension 21 has such a thickness that the extension 21 contacts the second semiconductor chip 12 in a bonding state, the dummy bumps 51 may be placed as illustrated in FIGS. 8-10.

Even if only the bumps 14 and the dummy bumps 51 illustrated in FIGS. 8-10 are placed, and no bumps (dummy bumps) are placed on the extension 21, advantages of providing the extension 21 in the lower chip in the COC structure are realized.

Since the space between the extension 21 and the second semiconductor chip 12 can be filled with the underfill resin 15, the advantage that the parallelism between the second semiconductor chip 12 on the upper side and the extension 21 on the lower side is improved can be realized.

Moreover, since the external terminals 18 are provided on the extension 21, wire bonding to the substrate can be performed.

Figure 11:
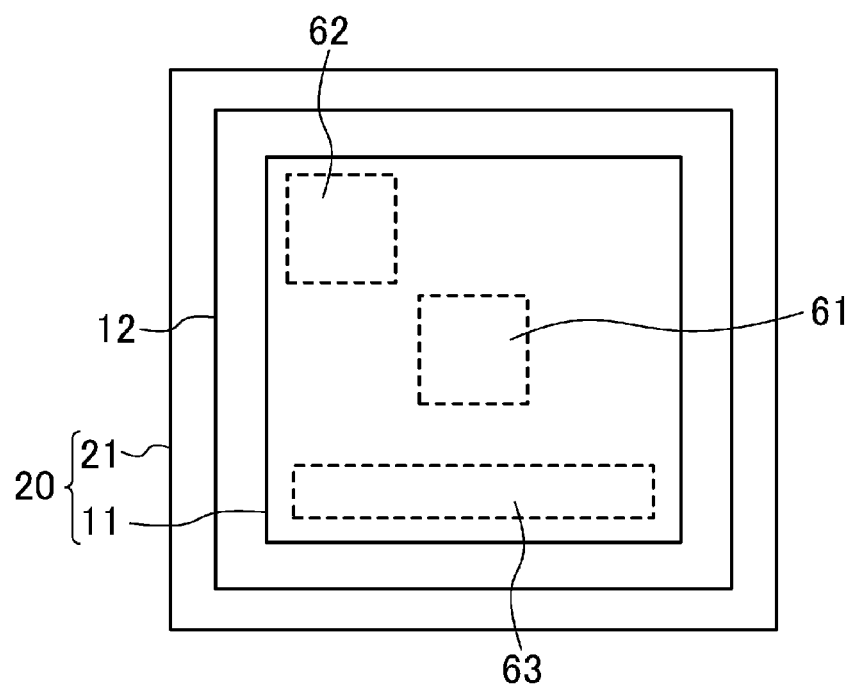
FIG. 11 is a plan view illustrating examples of a bump placement region of the example semiconductor device of the present disclosure.
Figure 12:
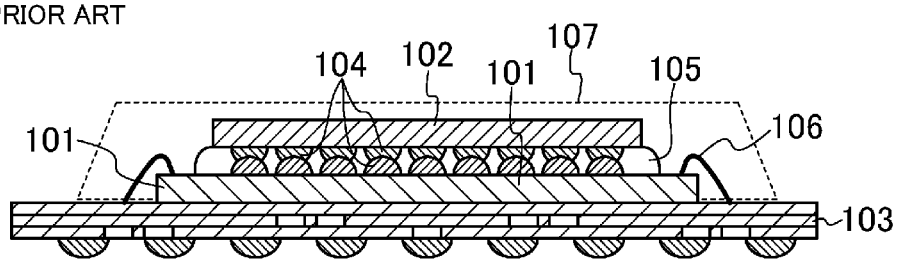
FIG. 12 is a view schematically illustrating a cross-sectional configuration of a semiconductor device of the prior art.
Figure 13:
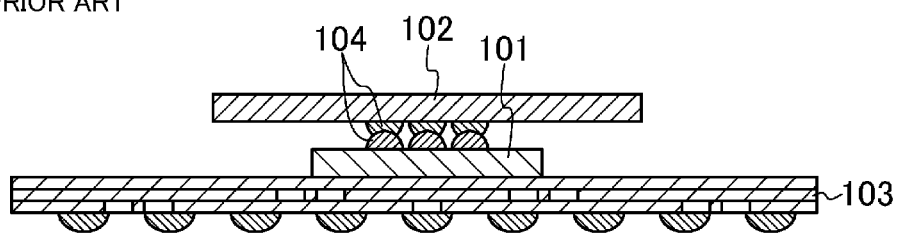
FIG. 13 is a view schematically illustrating a cross-sectional configuration of another semiconductor device of the prior art.

Placement of the bumps 14 configured to bond and electrically connect the first semiconductor chip 11 and the second semiconductor chip 12 together is not limited to the examples illustrated in FIGS. 8-10 (i.e., the bumps 14 are placed in a band shape so as to be apart from a pair of opposing sides of a surface of the first semiconductor chip 11). Another example is illustrated in FIG. 11.

For example, the bumps 14 may be placed in each of the following regions on the surface of the first semiconductor chip 11: a region 61 positioned near the center of the first semiconductor chip 11 so as to be apart from any side of the first semiconductor chip 11; a region 62 near any corner of the first semiconductor chip 11; and a region 63 along one or more of the sides of the first semiconductor chip 11. Moreover, the bumps 14 may be placed within each of the foregoing regions, and the dummy bumps 51 may be placed around the bumps 14 as in FIGS. 8-10.

Placement of the bumps 14 for electrical connection and placement of the dummy bumps 51 may be different from each other. For example, in FIG. 11, the bumps 14 may be placed within the region 63 along one side of the first semiconductor chip 11, and the dummy bumps 51 may be placed within a region along the opposite side of the first semiconductor chip 11. In such a case, even if it is necessary to concentrate the bumps 14 on a particular part, the dummy bumps 51 can be placed within other region, and therefore the parallelism can be ensured.

FIGS. 1-5 illustrate the examples where the extended semiconductor chip 20 is disposed on the lower side (i.e., the side close to the substrate 13), and the substrate 13 and the extension 21 are electrically connected together by wire bonding.

Figure 14:
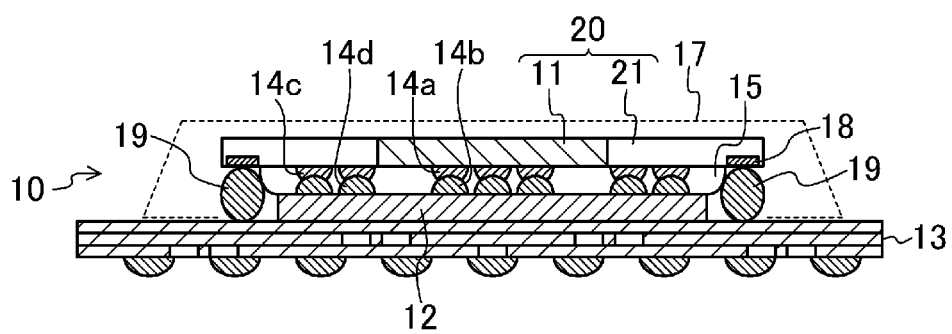
FIG. 14 is a view illustrating another example of the example semiconductor device of the present disclosure.

However, the present disclosure is not limited to such a configuration. Referring to FIG. 14, placement of the extended semiconductor chip 20 and the second semiconductor chip 12 may be vertically inverted. That is, the second semiconductor chip 12 may be on the lower side (i.e., the side close to the substrate 13), and the extended semiconductor chip 20 may be on the upper side. In such a case, the external terminals 18 provided on the extended semiconductor chip 20 and the substrate 13 are connected together through electrodes 19. The electrode 19 may be, e.g., a ball bump or a metal post.

According to such a configuration, the size of the substrate 13 can be reduced as compared to the configuration in which wire bonding is used as illustrated in FIGS. 1-5. Thus, a cost of the substrate 13 can be reduced.

The example where the extended semiconductor chip 20 and the second semiconductor chip 12 are stacked on each other and are mounted on the substrate 13 such as a circuit board has been described above. However, the extended semiconductor chip 20 and the second semiconductor chip 12 are not necessarily mounted on the substrate, and may be mounted on, e.g., a lead frame. In such a case, advantages similar to those in mounting on the substrate can be realized.

The foregoing configurations may be optionally combined together without departing from the spirit of the technique of the present disclosure.

According to the technique of the present disclosure, the parallelism and the wire bonding region can be ensured in the semiconductor device regardless of the vertical positional relationship of the chips. Thus, the present disclosure is particularly useful for the semiconductor device having the COC structure.

What is claimed is:

1. A semiconductor device comprising:
an extended semiconductor chip including
a first semiconductor chip and
an extension outwardly extending from a side surface of the first semiconductor chip; and
a second semiconductor chip connected to the extended semiconductor chip through a plurality of bumps and electrically connected to the first semiconductor chip,
wherein the first semiconductor chip is smaller than the second semiconductor chip,
at least one external terminal is provided on the extension, and
the plurality of bumps are placed so as not to be positioned within a transistor placement region of at least one of the first semiconductor chip or the second semiconductor chip.

2. The semiconductor device of claim 1, wherein
a plurality of first pads are provided on part of the second semiconductor chip facing the extension,
a plurality of second pads are provided on the extension, and
the plurality of bumps include first bumps placed between the first semiconductor chip and the second semiconductor chip, and second bumps placed between the extension and the second semiconductor chip.

3. The semiconductor device of claim 2, wherein
each first bump and each second bump have different heights.

4. The semiconductor device of claim 2, wherein
each first bump is connected to a corresponding one of third pads provided on the first semiconductor chip,
a recess is formed in each of the first, second, and third pads,
each first bump and each second bump have different heights, and
a size of the recess in each third pad connected to a corresponding one of the first bumps is different from a size of the recess in each first pad or each second pad connected to a corresponding one of the second bumps.

5. The semiconductor device of claim 1, wherein
a thickness of the extension is larger than that of the first semiconductor chip.

6. The semiconductor device of claim 5, wherein
the thickness of the extension corresponds to a thickness obtained by adding the thickness of the first semiconductor chip to a distance between the first semiconductor chip and the second semiconductor chip.

7. The semiconductor device of claim 2, wherein
each second bump disposed between the extension and the second semiconductor chip is connected to a corresponding one of the first pads of the second semiconductor chip.

8. The semiconductor device of claim 2, wherein each second bump disposed between the extension and the second semiconductor chip is connected to a corresponding one of the second pads of the extension.

9. The semiconductor device of claim 1, wherein
the plurality of bumps are placed within a region of at least one of the first semiconductor chip or the second semiconductor chip where a cell in which no malfunction due to a timing variation occurs is disposed, and
the cell in which no malfunction due to the timing variation occurs is at least one of an ESD protection cell, a Tie cell, a bonus cell, an area ratio adjustment cell, a power source capacity cell, an input Tie-fixed cell, or a level shifter.

10. The semiconductor device of claim 1, wherein
at least one of the plurality of bumps is disposed within a scribe lane or a seal ring region of at least one of the first semiconductor chip or the second semiconductor chip.

11. The semiconductor device of claim 1, wherein
at least one of the plurality of bumps is disposed within a chip corner cell region of at least one of the first semiconductor chip or the second semiconductor chip.

12. The semiconductor device of claim 1, wherein
at least one of the plurality of bumps is disposed on a power interconnect of at least one of the first semiconductor chip or the second semiconductor chip.

13. The semiconductor device of claim 2, wherein
the plurality of bumps include dummy bumps which do not electrically connect the extended semiconductor chip and the second semiconductor chip together, and
the dummy bumps are placed within a second region outside a first region where the first semiconductor chip and the second semiconductor chip are electrically connected together.

14. The semiconductor device of claim 13, wherein
the dummy bumps are provided as some of the second bumps placed between the extension and the second semiconductor chip.

15. The semiconductor device of claim 13, wherein
the dummy bumps are provided as some of the first bumps placed between the first semiconductor chip and the second semiconductor chip.

16. The semiconductor device of claim 13, wherein
the dummy bumps are made of a non-metal material.

17. The semiconductor device of claim 1, wherein
the extension is made of a metal material or resin.

18. The semiconductor device of claim 1, further comprising:
- a substrate on which the extended semiconductor chip and the second semiconductor chip are mounted,
- wherein the substrate is bonded to a surface of the extended semiconductor chip opposite to a surface of the extended semiconductor chip bonded to the second semiconductor chip, and
- the external terminal is a wire bonding pad, and is connected to the substrate through a thin metal wire.

19. The semiconductor device of claim 1, further comprising:
- a substrate on which the extended semiconductor chip and the second semiconductor chip are mounted,
- wherein the substrate is bonded to a surface of the extended semiconductor chip opposite to a surface of the extended semiconductor chip bonded to the second semiconductor chip, and
- the external terminal is connected to the substrate through a ball electrode.

* * * * *